United States Patent [19]

Higgins, Jr.

[11] Patent Number: 4,609,892

[45] Date of Patent: Sep. 2, 1986

[54] STRIPLINE FILTER APPARATUS AND METHOD OF MAKING THE SAME

[75] Inventor: Robert J. Higgins, Jr., Sunrise, Fla.

[73] Assignee: Motorola, Inc., Schaumburg, Ill.

[21] Appl. No.: 781,626

[22] Filed: Sep. 30, 1985

[51] Int. Cl.⁴ .................. H01P 1/203; H01P 7/08; H01P 11/00
[52] U.S. Cl. ...................... 333/204; 29/600; 333/222; 333/238; 333/246; 361/421
[58] Field of Search .............. 333/202, 203, 204, 205, 333/206, 207, 223, 238, 246, 222; 361/402, 412, 415, 421; 29/600

[56] References Cited

U.S. PATENT DOCUMENTS

| Re. 31,470 | 12/1983 | Bedard et al. | 333/204 |
|---|---|---|---|
| 3,534,301 | 10/1970 | Golembeski | 333/204 |
| 3,617,955 | 11/1971 | Masland | 333/204 |
| 3,838,367 | 9/1984 | Bex | 333/204 |
| 4,152,676 | 5/1979 | Morgenthaler et al. | 333/24.1 |
| 4,494,083 | 1/1985 | Josefsson et al. | 333/238 X |

FOREIGN PATENT DOCUMENTS 56-11401 9/1981 Japan .
1240860 7/1971 United Kingdom .

Primary Examiner—Marvin L. Nussbaum
Attorney, Agent, or Firm—Donald B. Southard; Edward M. Roney; Charles L. Warren

[57] ABSTRACT

An improved ceramic stripline filter assembly is disclosed which provides optimized performance characteristics by careful control of the gap thickness between the filter halves during the assembly process. The filter arrangement utilizes paddle leads which include central cavities or pocket holes to accept any excess solder during filter assemblage. Close tolerances are thereby obtained regarding the referenced gap thicknesses from filter to filter.

The method of fabricating the stripline filter assembly contemplates the use of a leadframe with the leads extending laterally from a unitary support structure. The leads are then cut or otherwise separated from this integral support after attachment of the leads to the filter body connection points. They may be pre-formed to any predetermined pattern after such separation.

15 Claims, 4 Drawing Figures

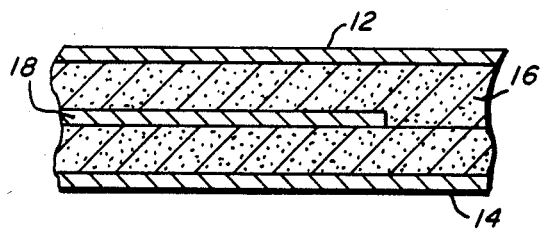
—PRIOR ART—
Fig. 1
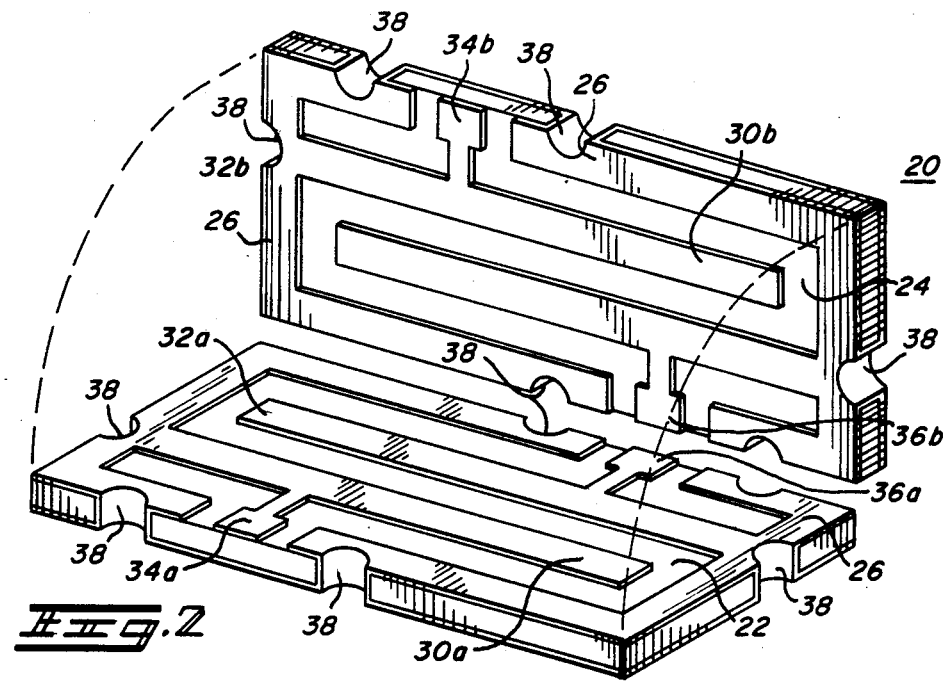
Fig. 2
Fig. 3
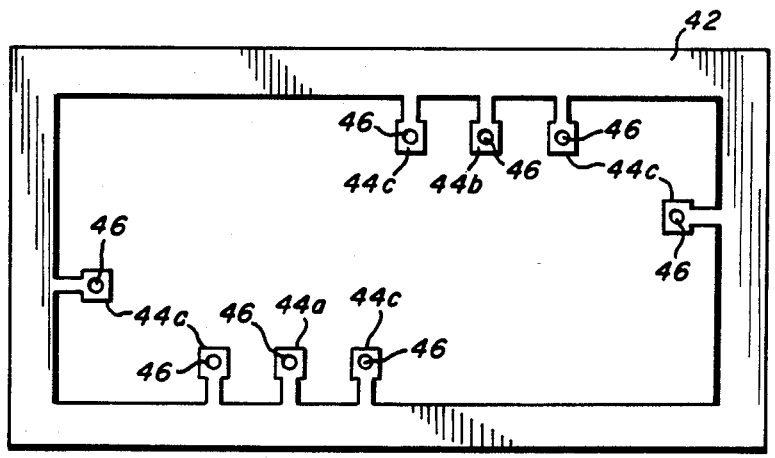

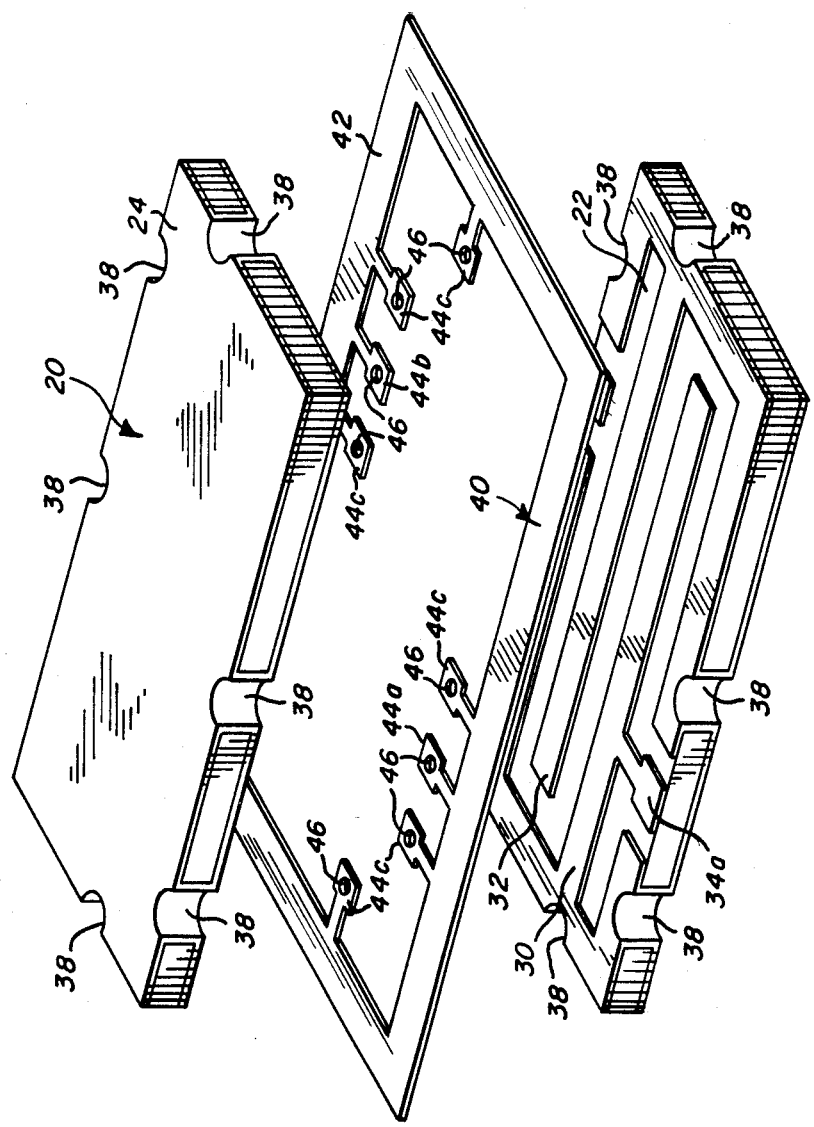

STRIPLINE FILTER APPARATUS AND METHOD OF MAKING THE SAME

BACKGROUND OF THE INVENTION

This invention relates in general to stripline filters and more particularly to an improved stripline filter apparatus and method for making the same wherein performance characteristics are optimized and maintained during the fabrication process.

Stripline filters are of course known in the art. They differ from microstrip structures in that they include top and bottom ground planes sandwiched over a body of dielectric material in which a resonant structure is embedded. Normally, there is an upper dielectric body and a lower dielectric body. Typically, the two dielectric bodies are provided with image circuit metallization on their interior surfaces of the base and top which are then joined and permanently attached together.

However, provision for connection to the internally positioned resonator structure must also be made if the resultant apparatus is to have utility. Conventional interconnection technology until now has involved the application of pre-formed "paddle" leads, or alternatively, "clip-on" leads. A major disadvantage of the conventional paddle lead is that the mechanical strength and integrity of the attachment is primarily dependent on the quality of the metal adhesion to the surface of the dielectric body of the filter. For the clip-on lead, a cut-out in the overall sandwich assembly is required to accommodate the associated lead. This cut-out requirement wastes a substantial portion of a module edge of the filter assembly and mechanical strength nevertheless leaves something to be desired. There are other disadvantages as well which will be discussed in more detail subsequently herein.

A number of dielectric materials have been used in the past. A plastic or resilient material, such as teflon, has been employed in the past and enjoyed widespread usage. After metal definition, a thin plastic sheet is utilized in between the two halves, i.e., base and top, which are then pressed together under sufficiently high pressure and heat until welded together. This forms a reasonably well assembled and reliable filter. However, it is not suited to applications where size and volume constraints are imposed, say, for example, in a miniaturized, hand-held radio pager or transceiver. This is because of the relative low dielectric constant of the teflon, on the order of two or three. For such miniaturized, portable applications, a ceramic substrate is advantageously utilized which has a dielectric constant of many orders higher, which then results in a resonant structure of far less size. That is, the quarter wave dimension of the resonator structure is a function of the dielectric value.

The perceived disadvantage of ceramic is that it cannot be simply pressed together in the manner permitted with the somewhat more resilient teflon based filter. With the ceramic substrate, the two filter halves typically are soldered together by known solder technology. However, with this soldering process, the thickness of the gap in the center of the sandwiched assembly, and hence the total thickness, which is a critical parameter of the associated filter, is determined by the amount of solder applied and the distribution thereof as well as solder wetting and other factors. Typically, this gap between filter sections may vary between three to twelve mils. This variation is undesirable as it effects a corresponding variation the bandwidth of the filter as well as other operating aberrations.

SUMMARY OF THE INVENTION

Accordingly, one object of the present invention is to provide an improved stripline filter assembly and method of making the same which overcomes the foregoing deficiencies.

A more particular object of the present invention is to provide a stripline filter utilizing ceramic substrate as a dielectric material wherein the tolerances for the center gap between filter sections may be closely held to a predetermined value.

Still another object of the present invention is to provide a stripline filter assembly of the foregoing type which utilizes an associated leadframe during fabrication thereof with provision to channel excess solder into a favorable distribution pattern.

In practicing the invention, a stripline filter arrangement is provided which includes a lower base and an upper cover of suitable ceramic material, each having a metallized ground plane on the outer surface, at least a portion of which extends around the edge to the inner surface. Each further includes at least one resonator device on the inner surface thereof which form mirror images of one another. A plurality of leads are provided, each with a cavity or pocket hole centrally located therein, which leads are respectively connected to the filter input, output and ground connection points. In this manner, any excess solder accruing during the molten solder process used to permanently attach the filter halves together will conveniently be accommodated in the lead pocket holes and not under the leads themselves. The result is a filter assembly wherein the gap between the base and cover filter halves is carefully controlled thereby optimizing performance characteristics and assuring uniformity from filter to filter.

The assembly of such filter may advantageously be carried out by the use of a leadframe with the various interconnecting leads attached thereto. the leadframe may be formed from a single piece of sheet metal. After the solder process to permanently attach the leads and the filter halves together, the leads may be cut free of the leadframe and the latter then discarded.

BRIEF DESCRIPTION OF THE DRAWINGS

The features of the present invention which are believed to be novel are set forth with particularity in the appended claims themselves. The invention itself, however, together with further objects and advantages thereof may be best understood by reference to the following description when taken in conjunction with the accompanying drawings, in which:

FIG. 1 is a fragmentary, cross-sectional view of a typical stripline filter apparatus;

FIG. 2 is a view in perspective of a stripline filter assembly with base and top separated to show the the internal resonator structure;

FIG. 3 is a planar view of an associated lead-frame useful in the stripline filter assembly of the present invention; and FIG. 4 is an exploded view of the stripline filter assembly of the present invention in which the leadframe is inserted between base and top filter sections prior to being attached together.

DESCRIPTION OF THE PREFERRED EMBODIMENT

Referring now to the drawings, a fragmentary cross-sectional view is shown in FIG. 1 of a typical stripline filter 10 which includes top and bottom ground planes 12 and 14 separated by a suitable dielectric material 16 in which at least one resonator strip device 18 is centrally positioned. The resonator is intended to be substantially a quarter wave at the desired frequency. The actual length is dependent upon the dielectric material utilized. The lower the dielectric constant, the longer the quarter wave length of the resonator; the higher the dielectric constant, the shorter the length necessary for the resonator.

As mentioned previously, the use of a plastic material for the dielectric, such as teflon, facilitates the manufacture of the overall stripline filter apparatus by reason of the manner of attachment of the filter halves. That is, the teflon material becomes suitably welded together under sufficient high enough pressure and heat. However, the size requirement because of the relatively low dielectric constant, on the order of two or three, makes the teflon fabricated stripline filter unsuitable for applications having severe volume or size constraints, such as, for example, miniaturized, hand-held radio pagers or transceivers.

For this and other reasons, the present invention contemplates the use of a dielectric material at least of an order or more higher than the referenced teflon. One such dielectric material meeting this criteria is ceramic. Ceramic may exhibit a dielectric constant of 10 to 1000. Although ceramic effectively reduces the actual length of the resonator(s) to an advantageous value, it creates other problems in the fabrication process thereof. Ceramic, unlike teflon or other plastic materials, is substantially non-resilient. As a consequence, very different assembly techniques are required. The most commonly used methodology is the metallization of the ceramic substrate halves which then may be permanently attached together by a suitable molten solder process as will be described in more detail herein subsequently.

The present invention is directed to stripline filter arrangements which are fabricated with ceramic or like material. Such a stripline filter assembly is shown in FIG. 2 at 20. This filter includes a base 22 and a cover 24 of properly dimensioned ceramic material. Each of these ceramic filter halves is metallized with a ground plane on the outer surface, such as shown in FIG. 1 at 12 and 14. these ground planes extend at least in part around the edges thereof to form a strip or border 26 on the inner surface, substantially as shown. Continuity between the outer ground planes to the inner borders 26 is maintained by the various vias 38, which continue the metallization from the ground plane to the inner borders 26 at strategic locations around the periphery of the filter 20.

To complete the metallization, a resonator structure is included on the inner surface. In the embodiment as shown, one such resonator circuit is constructed to be the mirror image of the other. However, it is to be understood that this mirror imaging of resonator circuits need not be effected. The resonators themselves may be mismatched in terms of physical positioning. All that need be positionally matched are the input and output pads (34$a$-$b$ and 36$a$-$b$) as well as the interior borders 26 serving as ground surfaces. The resonator structure preferably includes one or more resonator strips, such as 30$a$-30$b$, and 32$a$-32$b$, as illustrated in the embodiment of FIG. 2. It is further understood that there may be more or less resonator strips without departing from the purview of the present invention.

As is customary, the filter assembly 20 includes an input, shown as bonding pad elements 34$a$ and 34$b$. Like bonding pad elements 36$a$ and 36$b$ form the output for filter 20. Leads (not shown in FIG. 2) are attached to the input and output as well as one or more ground connection points and the filter halves 22 and 24 are suitably attached to one another, such as by a molten solder process. Solder reflow is but one acceptable method. Such technique is well known in the art such that further and more detailed description is deemed unnecessary at this juncture. In any event, whatever the manner of soldering the filter sections together, problems occur in the reliability of the stripline filter thus assembled in terms of performance characteristics. This is because the solder material is not uniformly applied, excess solder works itself under the lead areas, filter sections warp and are not clamped together, and like factors, all giving a rise to gap thicknesses in the stripline filter which undesirably vary from filter to filter. Typically, such gaps may vary between three to twelve mils. This variation in thickness results in a corresponding variation in filter bandwidth. What is needed then is some means or method of assuring a close control over this dimension of tolerance in the fabricated filters.

Still another problem has been frequently encountered in prior filter structures. This involves the type and attachment procedure of the leads to the filter body. As mentioned previously, the type of leads incorporated in past filter structures have been the preformed "paddle" or "clip-on" type. These leads are usually applied individually to the filter body. Typically, a lead is attached to the input connection point, one to the output and one or more to selected ground points. The disadvantage of the paddle lead is that the mechanical strength and integrity of the attachment is dependent on the quality of the metal adhesion to the surface of the dielectric body of the filter. For the clip-on lead, a cut-out in the sandwich body of the filter is required to expose a single substrate thickness and thus wastes a substantial portion of the filter module edge, maybe as much as 50 mils. It goes without saying that this makes the filter more difficult to process.

These deficiencies are not present in the filter structure of the present invention. Prior to soldering or otherwise attaching the base 22 to the cover 24 of the filter 20 together, the leadframe 40 is sandwiched between the filter halves. This leadframe includes appropriate leads, in this case paddle leads 44a, 44b and 44c, extending laterally from support 42. The leadframe 40 may be advantageously fabricated from a single, thin, say 2 to 10 mils, piece of sheet metal. When sandwiched between the filter halves 22 and 24, such as depicted in FIG. 4, the individual leads overlie the appropriate connection points on the inner surface thereof. Lead 44a overlies the filter input connection point 34a–b, lead 44b the output 36a–b, and leads 44c selected ground connection points. As many ground leads may be utilized as deemed desirable. In this case, six are shown. It should also be noted that it is not necessary that prior to processing that the leadframe remain planar. It could be pre-formed so long as the filter leads to be positioned between the filter halves remain essentially co-planar. After the solder process has been effected, the leads 44a through 44c may undergo shearing and forming to individualize them and the remainder of the leadframe 40 itself may be simply discarded.

An equally important aspect of this invention is the provision for accommodating excess solder under the paddle leads during the previously described attachment process. When leadframe 40 is positioned between filter sections 22 and 24, the assembly is compressed or squeezed together during the solder reflow process. In this manner, the gap thickness is held to essentially the thickness of the metallization of the resonator structure plus paddle leads of the leadframe 40. This can be held to very close tolerances if provision is made to accommodate any excess solder under the leadframe paddle leads themselves. This is conveniently and effectively accomplished in the present instance by the inclusion of a centrally placed cavity or pocket hole 46 in each of the paddle leads 44a through 44c, substantially as shown. In this manner, any excess solder is accommodated in these pocket holes and not under the paddle leads themselves resulting in filters that are reliable and uniform in operating characteristics while exhibiting lower manufacturing costs.

What is claimed is:

1. An improved stripline filter apparatus, comprising in combination:
   a ceramic substrate base having a metallized ground plane on the outer surface and at least one resonator device on the interior surface thereof, said ground plane having at least a portion thereof extending around the edges to form a border on the interior surface;
   a ceramic substrate cover having a metallized ground plane on the outer surface thereof, each ground plane having at least a portion thereof extending around the edges to form an inner surface border matching said border on said base;
   an interconnection arrangement comprising a plurality of leads sandwiched between said base and cover and connected to respective input, output and ground connection points; and
   said base and cover being attached to each other by molten solder and wherein cavities in said plurality of leads form reservoirs for accommodating excess solder.

2. A stripline filter in accordance with calim 1 wherein said ceramic cover includes at least one resonator device on the interior surface which forms a mirror image of said at least one resonator an said ceramic base.

3. A stripline filter in accordance with claim 1 wherein said resonator circuit includes a plurality of resonator strips.

4. A stripline filter in accordance with claim 2 wherein there are two such resonator strips.

5. A stripline filter in accordance with claim 2 wherein there are three such resonator strips.

6. A stripline filter in accordance with claim 2 wherein said resonator strips are each substantially a quarter wave in length at the desired operating frequency.

7. A stripline filter in accordance with claim 1 wherein the leads are initially attached to an associated leadframe and later separated therefrom to form individual leads.

8. A stripline filter in accordance with claim 1 wherein there are multiple ground leads connected to respective ground connection points.

9. A stripline filter in accordance with claim 7 wherein a ground lead is provided on either side of each of said filter input and output connection points.

10. A method of making a ceramic stripline filter assembly, comprising the steps of:
    providing a base of ceramic material and metallizing a ground plane on the outer surface thereof, at least a portion of which extends around the edge to the inner surface, and at least one resonator device on the inner surface thereof;
    providing a cover of ceramic material and metallizing an outer ground plane with at least a portion thereof extending around the edge to the inner surface and matching said portion on said base;
    providing a leadframe with a plurality of leads attached thereto, each having a central cavity therein, and positioning the leadframe so that said plurality of leads make respective contact with the input, output and ground connection points;
    attaching said base and cover together with a molten solder process with the lead cavities forming reservoirs for accommodating excess solder; and
    separating the plurality of leads from said associated leadframe.

11. The method of making a ceramic stripline filter in accordance with claim 10 which comprises the step of providing at least one resonator device on the interior surface of said cover which forms a mirror image of said at least one resonator device on said base.

12. The method of making a ceramic stripline filter in accordance with claim 10 which comprises the step of fabricating the leadframe from a single piece of sheet metal.

13. The method of making a ceramic stripline filter in accordance with claim 10 which includes the step of attaching the base and cover of the stripline filter together by a solder reflow process.

14. A method of making a ceramic stripline filter in accordance with claim 10 further comprising the step of compressing and holding the base and cover of the stripline filter together during soldering so that the gap there between is limited to essentially the thickness of the leadframe assembly and metallization of the resonator strips.

15. A method of making a ceramic stripline filter in accordance with claim 10 which comprises the further step of forming the leads in a predetermined pattern after the separation thereof from the leadframe.

* * * * *